United States Patent [19]

Pollack

[11] 4,294,008
[45] Oct. 13, 1981

[54] METHODS OF MANUFACTURING AND SECURING TUBULAR WIRE-RETAINING ANCHORS TO CIRCUIT BOARDS

[75] Inventor: Frank J. Pollack, Naperville, Ill.

[73] Assignee: Western Electric Company, Inc., New York, N.Y.

[21] Appl. No.: 52,655

[22] Filed: Jun. 27, 1979

[51] Int. Cl.³ .............................................. H05K 3/20
[52] U.S. Cl. ....................................... 29/831; 29/850; 156/250; 156/327
[58] Field of Search ................. 29/825, 832, 846, 235, 29/831; 156/264, 265, 297, 327, 250, 251; 174/68.5; 248/205 A, 74 PB, ; 428/343, 901; 138/99, DIG. 2; 264/150, 151; 339/17 C

[56] References Cited

U.S. PATENT DOCUMENTS

| | | | |
|---|---|---|---|
| 2,979,554 | 4/1961 | Maitland | 339/17 C |
| 3,154,281 | 10/1964 | Frank | 29/832 X |
| 3,377,699 | 4/1968 | Dinella et al. | 29/832 X |
| 3,454,249 | 7/1969 | Geisinger | 248/74 PB X |
| 3,503,568 | 3/1970 | Galley | 428/343 X |
| 3,516,631 | 6/1970 | Santucci | 248/205 A X |
| 3,777,632 | 12/1973 | Pepmeier | 156/250 X |
| 3,913,876 | 10/1975 | McSherry . | |
| 4,212,097 | 7/1980 | Portinari et al. | 29/235 X |

FOREIGN PATENT DOCUMENTS 1078193  8/1967  United Kingdom .

Primary Examiner—Nicholas P. Godici
Assistant Examiner—C. J. Arbes
Attorney, Agent, or Firm—K. R. Bergum

[57] ABSTRACT

Several tubular wire-retaining anchor embodiments (10, 10') are disclosed, as are several methods of manufacturing and securing the same to a supporting substrate, such as a circuit board (24). In accordance with one preferred embodiment (10), the tubular anchor is either molded out of suitable plastic material, or preferably formed as a short, severed cylindrical segment of an elongated section of plastic tubing (12). As needed, the anchors (10) are positioned in a desired spaced array on the circuit board (24) and adhesively bonded thereto. This is most readily accomplished by positioning each anchor (10) on a different droplet (28b), preferably comprising the second part of a two-part adhesive or cement (28), with the first part activator (28b) being pre-coated on at least a portion of the outer surface of the anchor. Upon each anchor (10) being brought into contact with an adhesive droplet (28b), the latter rapidly hardens to form a reliable fillet-shaped bond (28c) on either side of the juncture between the anchor and circuit board. In accordance with the second preferred anchor embodiment (10'), a longitudinally disposed slit (36) is formed through the wall thereof so as to allow the snap-in confinement of surface wiring therewithin, as well as the releasable removal of such wiring therefrom.

7 Claims, 8 Drawing Figures

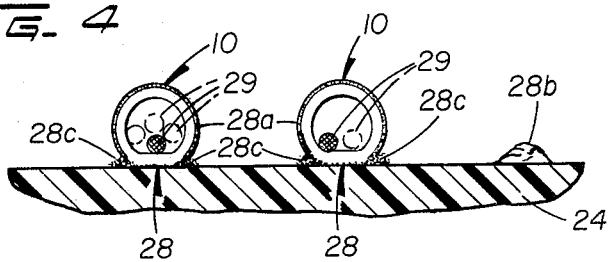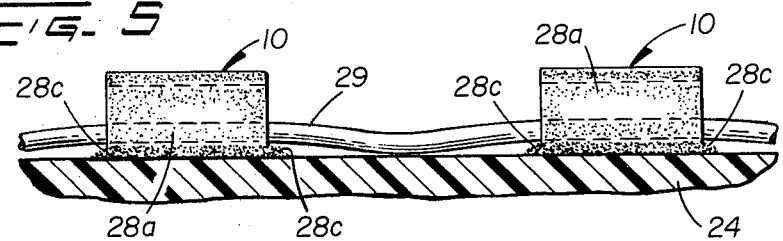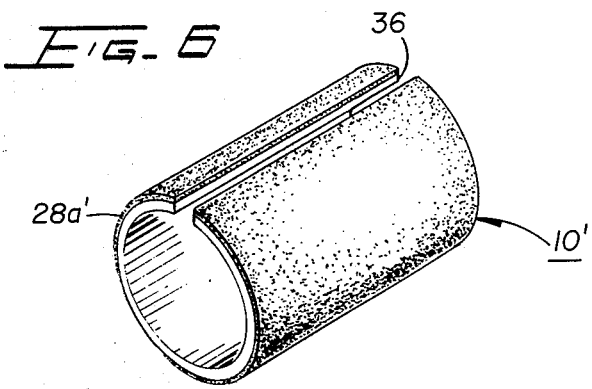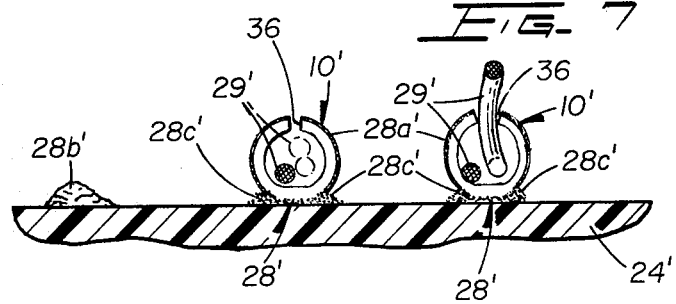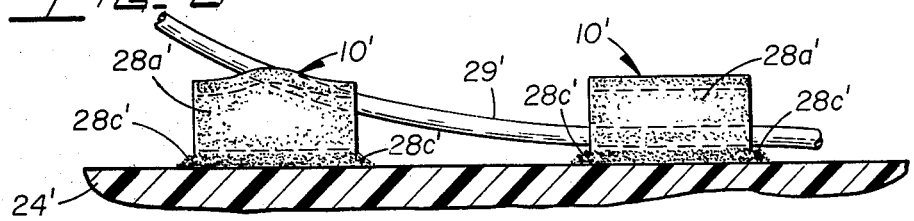

METHODS OF MANUFACTURING AND SECURING TUBULAR WIRE-RETAINING ANCHORS TO CIRCUIT BOARDS

BACKGROUND OF THE INVENTION

1. Field of the Invention

This invention relates to retaining members for elongated articles and, more particularly, to methods of manufacturing tubular-shaped anchors adapted to retain and guide surface wiring on a supporting substrate.

2. Description of the Prior Art

In the assembly, as well as repair, of high density, complex circuit boards, particularly those of the multi-layer type, it is often necessary to run discrete lengths of wire (generally referred to hereinafter as surface wiring) in diverse directions between various circuit points that must be interconnected. Such surface wiring is most often required to correct for defects which, with respect to multi-layer circuit boards, may frequently involve defective thru-hole connections. Such defects, unfortunately, often are not detected until after the complete assembly and testing of the composite board.

As such circuit boards typically incorporate a large number of integrated and/or hybrid circuits, as well as other related components thereon, any possible repair of the assembled board through the use of discrete surface wiring is very important, as the manufactured cost of one of such boards may often amount to hundreds of dollars. Discrete surface wiring may also be required on either an interim or continuing basis when it is determined that one or more minor circuit design changes must be made after all of the circuit design parameters, art masters, drawings and specifications associated with the layout of a given circuit board have been completed, and manufacture of the board has commenced. Modifying such extensive manufacturing information in order to make one or more relatively minor circuit design changes is generally prohibitive from a cost standpoint.

It thus becomes readily apparent that there has been a need in the electronics industry for a wire anchoring device adapted to both secure and guide discrete surface wires along diverse paths on either one or both sides of a circuit board, which board may often be of the complex multi-layer type (often referred to as a circuit pack).

There have been a number of prior wire-anchoring devices proposed, as well as employed, for this purpose. For example, one such device, referred to as a wire tie-down, has been molded out of a suitable plastic material, and formed with two upwardly extending resilient leg portions and an integral, downwardly extending stem portion. The leg portions are configured to curve inwardly toward each other so as to define a resilient wire-confining area therebetween, whereas the integral stem portion is dimensioned so as to extend through a receiving thru-hole either pre-drilled or subsequently drilled in a circuit board for that purpose. Such a tie-down requires that the lower extremity of the stem portion protrude a short distance outwardly from the underside of the circuit board on which it is mounted so that through the application of heat thereagainst, such as from the tip of a soldering iron, the end portion of the stem may be flared out to firmly secure the tie-down to the board.

In addition to the appreciable costs involved in molding and securing such a tie-down to a circuit board, its use is disadvantageously also dependent on the availability of a plurality of auxiliary circuit board thru-holes to selectively receive it. While such auxiliary holes may not be particularly difficult to provide in a completely assembled single-sided board having low density circuitry thereon, any such holes may be very difficult, if not impossible, to provide in high density double-sided boards, and in particular, multi-layer boards, especially after their complete assembly. However, even when the cross-sectional area and circuit density of a given board is such that an appreciable number of auxiliary holes may be pre-drilled, or subsequently drilled, therein for noncircuit functions, they may not always be located at the most desirable locations on the board, and spaced, so as to allow any necessary discrete surface wires to be directed along the shortest and/or most practical path(s) between the various circuit points that must be interconnected. Complicating this latter problem, of course, is the fact that the number of surface wires required, and the most desirable paths that they should follow, will normally be dependent on the type of circuit defect(s) uncovered only after the complete fabrication of the circuit board.

Another prior molded type of plastic wire-anchoring device is disclosed in British Pat. No. 1,078,193, and comprises a resilient U-shaped wire-receiving portion and a lower flat base portion. The latter portion is adapted to rest on the surface of a supporting substrate, and preferably is secured thereto by a suitable adhesive. As disclosed, the adhesive may be in the form of either a pressure sensitive coating initially applied to the base portion of the wire-anchoring device, or alternatively, may be applied thereto, or on the substrate, or on both, prior to the mounting of the device. Such a wire-anchoring device, because of its peculiar configuration, must necessarily be molded, and when fabricated with a pressure sensitive adhesive-backing on the base side thereof, together with an associated removable release sheet, becomes quite expensive to manufacture on a unit cost basis.

Still another prior molded type of device referred to as a cable tie support is disclosed in U.S. Pat. No. 3,913,876, of W. E. McSherry. That device comprises a flat base portion adapted to releasably retain an associated cable tie that is suitably connected thereto. As disclosed, the device may be either adhesively bonded to an associated supporting substrate, such as by means of a pressure-sensitive adhesive tape initially applied to the base portion, or secured to the substrate by fastening members extending through aligned pre-formed holes in the base portion and the substrate.

While the use of such a two-piece cable tie device is advantageous for anchoring a large number of wires, such as in a multi-conductor cable, to a substrate, it is a relatively expensive device not only to manufacture and assemble, because of its molded two-piece construction, but to use when only one or several surface wires need be anchored to a substrate in a given circuit fabrication or repair application. In addition, such a cable tie device requires considerable surface area on a circuit board because of both the nature of its two-piece construction, and the need to have the cable tie of a size that may be readily physically manipulated.

SUMMARY OF THE INVENTION

It, therefore, is an object of the present invention to provide a simplified, inexpensive, and reliable method and molded device for securing and guiding either one, or a plurality, of elongated members, such as surface wires, to and along a supporting substrate, such as a circuit board.

In accordance with the principles of the present invention, the above and other objects are realized in one preferred embodiment wherein the wire-retaining anchor is of ring-shaped or any other tubular configuration. Such an anchor may be either molded out of a suitable plastic material, such as polyvinyl chloride, or preferably formed as a short, severed cylindrical segment of an elongated plastic tube of the same material. As needed, the anchors are positioned in a desired spaced array on the circuit board and adhesively bonded thereto. This is preferably accomplished by positioning each anchor on a different adhesive or cement droplet previously deposited on the circuit board. Upon each droplet solidifying, a reliable fillet-shaped bond is formed on either side of the juncture between the anchor and circuit board. One or more surface wires, as required, may thereafter be readily threaded through the bonded anchors to reliably secure them to the circuit board.

Also in accordance with the principles of the invention, each tubular-shaped anchor may be pre-coated with a first-part accelerator or activator of a two-part adhesive or cement. Many of such two-part adhesives or cements generally have the advantageous characteristics of allowing an appreciable period of time to elapse before a substrate deposited droplet of the second part thereof, by itself, will harden, but which droplet will very rapidly harden upon being brought into contact with the first part activator when pre-coated on the anchor.

In accordance with still another aspect of the invention, illustrated in a second embodiment, the tubular-shaped anchors are each formed with a longitudinally disposed slit through the wall thereof so as to allow the snap-in confinement of surface wiring therewithin, as well as the releasable removal of such wiring therefrom.

BRIEF DESCRIPTION OF THE DRAWINGS

FIG. 4 is a fragmentary, sectional view, taken along the line 4—4 of FIG. 3, illustrating two of the anchors of FIG. 1 as secured to the circuit board by fillet-shaped adhesive bonds;

FIG. 5 is a fragmentary side elevational view, taken along the line 5—5 of FIG. 3, illustrating two of the anchors as bonded to the circuit board of FIG. 3;

FIG. 6 is an enlarged, perspective view of a second preferred embodiment of the invention wherein a tubular-shaped anchor is formed with a longitudinally disposed slit through the wall thereof to facilitate the snap-in confinement of surface wiring therewithin in accordance with the principles of the present invention, and FIGS. 7 and 8 are fragmentary, sectional and side elevational views, respectively, illustrating two anchors of the type depicted in FIG. 6 as bonded to a circuit board, and after surface wiring has been inserted within each anchor through the slit formed in the wall thereof.

DETAILED DESCRIPTION OF THE INVENTION

Figure 1:
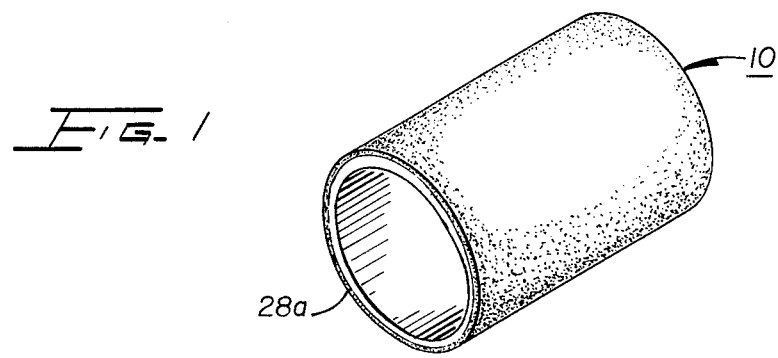
FIG. 1 is an enlarged, perspective view of one preferred tubular, wire-retaining anchor embodying the principles of the present invention.

With particular reference first to FIG. 1, there is depicted a cylindrically-shaped anchor 10 made out of a suitable material, such as polyvinyl chloride plastic. Such anchors may be molded as discrete articles, but preferably are made out of elongated plastic tubing which is sliced or cut into a plurality of discrete segment-defining anchors of cylindrical or any other tubular configuration. When made in accordance with the latter method, it becomes readily apparent that the anchors, on a unit basis, are very inexpensive, typically costing from only several cents to a fraction of one cent each, the actual cost depending in part on the size of the anchors and the type of material out of which they are made for a particular application.

Figure 2:
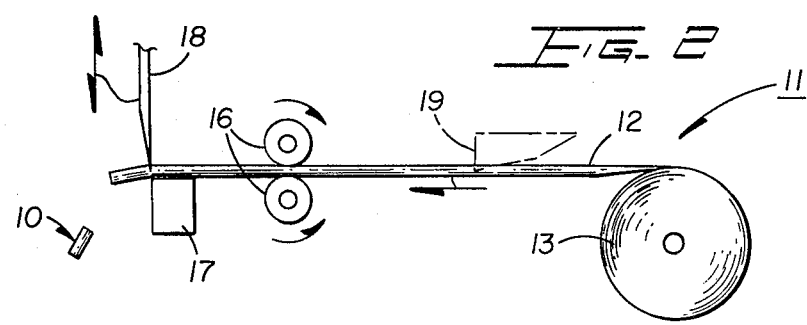
FIG. 2 is a diagrammatic view of an apparatus for slicing plastic tubing into short, segment-defining anchors, and for optionally forming a longitudinally disposed slit through the wall thereof in accordance with the principles of the present invention.

FIG. 2 diagrammatically illustrates an apparatus 11 for slicing a supply of plastic tubing 12 into a plurality of discrete, cylindrical segments defining the anchors 10. Such an apparatus may comprise a supply spool 13 of plastic tubing 12, a pair of feed rolls 16, for continuously or incrementally advancing the tubing, a platen 17 and a cooperative, reciprocally actuated cutter, such as a knife blade 18, for slicing the tubing into segment-defining anchors 10 of predetermined length. For reasons described in greater detail hereinafter, in connection with a second preferred anchor embodiment, an optional cutter, such as in the form of a sharp triangular blade 19, shown in phantom in FIG. 2, may be employed to form a continuous longitudinally disposed slit through the wall of the tubing 12 as it is being advanced by the feed rolls 16.

Figure 3:
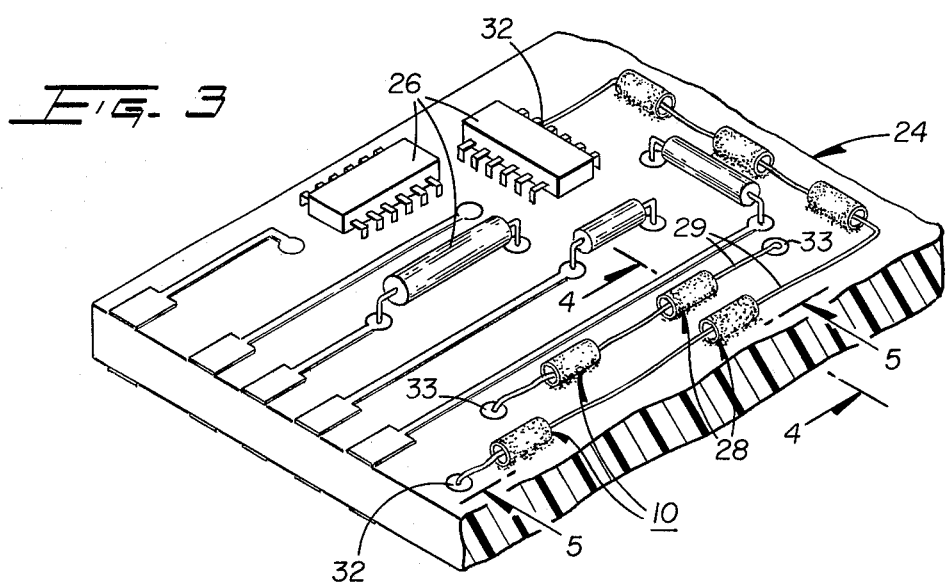
FIG. 3 is a fragmentary perspective view of an illustrative circuit board with a plurality of printed circuit paths formed thereon, and with a plurality of discrete circuit components mounted thereon, and further having an array of wire-retaining anchors of the type illustrated in FIG. 1 bonded to the upper surface of the circuit board for reliably securing surface wiring thereto.

The anchors 10 may be adhesively bonded in any desired spaced array to the outer surface of a circuit board, such as along the paths on a circuit board 24 having various electrical components and devices 26 mounted thereon, as illustrated in FIG. 3. In regard to bonding, either a one-part or a two-part adhesive or cement 28 may be employed to form the bonds. However, a two-part adhesive or cement, such as sold commercially by the Locktite Corporation, in a kit known as Tac-Pac, has been found to be particularly effective and advantageous for bonding the anchors to the circuit board, when sequentially applied in accordance with the principles of the present invention. In the interest of brevity, reference will normally be made to only adhesives hereinafter, but it should be understood that the use of the word "adhesive" is intended to embrace similar type cements.

Considering the bonding operation more specifically, it has been found to be very advantageous to initially pre-coat either the particular length of the plastic tubing out of which the anchors are preferably made, or the individual anchors, regardless how made, with the first part accelerator or activator of the aforementioned two-part cement 28. Such an anchor coating, identified by the reference numeral 28a, is shown for purposes of illustration as having not only an exaggerated thickness dimension in FIGS. 1 and 4, but a textured surface in FIGS. 1–5. It is understood, of course, that such a coating would normally be smooth and non-tacky in accordance with the principles of the present invention. With such a coating 28a, only droplets 28b (see FIG. 4) of the second part of the cement 28 need be deposited on the surface of the circuit board 24 at the discrete locations where the tubular-shaped anchors 10 are to be respectively bonded.

This has a further advantage in that by avoiding contact between the first and second parts of the cement 28 until the anchors 10 are brought into respective contact with the second part droplets 28b on the circuit board, the droplets will not solidify until either a substantial period of time, such as on the order of 5 to 30 minutes has elapsed, or until the anchors, with first part activating coatings thereon, are brought into contact with the second part droplets. In contrast, if the first and second parts of most typical types of two-part cements (or adhesives) are intermixed either prior to being deposited as composite droplets on a circuit board, or applied in succession on common discrete areas thereof, the resulting intermixed droplets will generally solidify in a period of 5 to 30 seconds. Such short hardening periods are also quite typical with most ready-mixed, i.e., one-part adhesives or cements, such as those based on an epoxy formulation.

It becomes readily apparent that any hardening period of less than 30 seconds unfortunately generally would provide an operator with insufficient time to initially deposit a number of second part droplets (or a number of successively applied first and second part droplets) on a circuit board, and to thereafter position a series of the tubular anchors of the type embodied herein on the respective droplets before the latter would have solidified.

A typical surface wiring operation will now be described, wherein in the repair of a given circuit board 24, one or more discrete surface wires 29, such as depicted in FIGS. 3–5, must extend between two or more circuit points 32 or 33 on a given side of the board. Initially, adhesive or cement droplets 28b, preferably metered out of a nozzle (not shown), either manually or automatically, are initially deposited in a desired spaced array along the surface of the board 24 to define the desired path(s) for the necessary surface wiring 29. Thereafter, a corresponding series of tubular-shaped anchors 10, preferably pre-coated with the first part 28a of a two-part adhesive or cement 28, are respectively positioned, with the proper orientation, on the droplets 28b. Upon each pre-coated anchor 10 making contact with a given droplet 28b, the latter very rapidly hardens to form a reliable fillet-shaped bond 28c (best seen in FIGS. 4 and 5) on either side of the juncture between the anchor and circuit board.

It is readily apparent, of course, that in bonding a plurality of anchors 10 to the circuit board 24, an operator could, if desired, alternately place a single droplet 28b on the board at one desired location and, thereafter, place an anchor 10 on that droplet, before applying a second droplet on the board, and then placing a second anchor on that droplet, and continuing in that manner. This sequence of operating steps would normally require considerably more time than when a series of adhesive or cement droplets are initially deposited on a circuit board, followed by the positioning of a corresponding number of anchors 10 on the respective droplets. The latter method also lends itself more readily to an automated system for applying not only the droplets successively or simultaneously on the circuit board, but for respectively positioning the anchors on the droplets either successively or simultaneously. In order to facilitate the manual positioning of the anchors 10 on the droplets 28b, it is advantageous for an operator to use a suitable handing tool, such as in the form of long-nosed pliers, or tweezers (not shown).

It should also be appreciated, of course, that a first part adhesive coating, if desired, could be applied to either a selected area (or areas), or to one or both major surfaces, of a circuit board, with the second part of the adhesive, such as in the form of a droplet for each anchor, and an anchor, being placed at any desired location on the coated circuit board surface either in rapid succession, or simultaneously with automated apparatus.

After a given array of anchors 10 have been secured in one or more arrays to the circuit board 24, by means of fillet-shaped adhesive bonds, best seen in FIG. 4, one or more discrete surface wires 29 may be selectively threaded through the bonded anchors to thereby reliably secure the wires to the board.

Advantageously, when using anchors of the type embodied herein, neither the number nor the positioning thereof is in any way dictated by the locations of any pre-formed receiving holes in the circuit board, as is the case with one of the aforementioned prior art types of wire-retaining devices. As such, the anchors 10 may be located to establish the shortest, or at least the most practical path(s) that could be established between two circuit points on the board to carry out any given circuit assembly or repair operation.

Another advantage of the anchors embodied herein, as previously noted, is that they may be inexpensively fabricated, either as individually molded parts, or preferably as short tubular segments sliced or cut from an initially elongated section of plastic tubing. In the case of the anchors being formed in accordance with the latter method, it also becomes readily apparent that by simply having two or more supplies of plastic tubing of different diameters, the anchors may be readily fabricated to accommodate any number of wires of either the same gauge, or different gauges, as required for a given surface wiring application. Such versatility, with the attendant low cost of manufacture involved, is not possible with the aforementioned prior art types of wire-retaining devices, having flat base portions for securement to a supporting substrate, and which devices, because of their peculiar configurations, must be molded.

In accordance with a second alternative embodiment of the invention illustrated in FIGS. 6–8, an anchor 10', which may be either molded, or preferably formed out of plastic tubing, as in the case with the anchor 10 of the first embodiment, is further formed with a longitudinally disposed slit 36 that extends through the wall thereof. Such a slit allows one or more wires 29', for example, to be inserted and releasably confined therewithin by simply being forced through the gap defined by the slit in a snapin manner. Alternately, of course, the wire(s) could be threaded through the anchors 10' in the same manner as is done with the closed-wall anchor 10 of the first embodiment.

The slit 36 in the anchor 10' may be formed either before or after the securement of the anchor to a supporting substrate, such as the circuit board 24'. When the anchors 10' are made out of plastic tubing, the slit 36 in each anchor is most readily provided by initially forming a continuous, longitudinally disposed slit through the wall of the tubing out of which the anchors are subquently cut, or sliced, as short segments of the tubing. Such a slit may be formed with any suitable tool having a sharp cutting edge, such as with the aforementioned optional cutter blade 19 shown symbolically and in phantom in the apparatus 11 of FIG. 2.

It is readily apparent, of course, that a closed-wall anchor (10) could be easily transformed into an anchor 10' after having been bonded to a circuit board. This operation could prove advantageous even after surface wiring had been threaded through one or more closed-wall anchors if, for example, it was later ascertained that one or more of the anchored surface wires had been inadvertently threaded therethrough, which could necessitate that such wiring be withdrawn therefrom and re-routed so as to correctly repair a given circuit defect.

It should be appreciated, of course, that the amount of force required to urge any given sized wire 29' through the slit 36 formed in the wall of an anchor 10' will depend upon a number of factors, such as the inherent resiliency of the plastic material employed, the wall thickness of the anchor, and the width of the slit formed therein. While polyvinyl chloride plastic has been found to provide a very desirable degree of resiliency when used to make the anchors 10', other plastic materials, such as Nylon ®, polyethylene and polyurethane may also be employed to make either the anchors 10 or 10' in accordance with the first and second embodiments, albeit anchors made of certain of the latter types of plastic would normally tend to be less resilient than when made of polyvinyl chloride.

In all other respects, the split-ring configured anchor 10' of the second embodiment is identical to the closed-wall anchor 10 of the first embodiment in terms of the manner in which it may be fabricated, pre-coated and subsequently bonded to a circuit board. To that end, like, but primed, reference numerals are employed in FIGS. 6–8 to identify the corresponding anchor-to-circuit board bonds, surface wires and circuit board selectively illustrated in FIGS. 1–5.

What is claimed is:

1. A method of forming discrete circuit wiring on a circuit board including securing a tubular-shaped anchor having an outer wall surface of continuously arcuate profile in the circumferential direction, and adapted to retain an elongated element therewithin, on a circuit board, comprising the steps of:
    applying a viscous portion of adhesive on the surface of said circuit board at a desired anchor location, said viscous portion comprising the second part of a two-part adhesive, with the first part being initially applied at least to a portion of the outer arcuate wall surface of said anchor, and being of a type that readily dries as a non-tacky coating at ambient temperature, and which requires no protective covering prior to said anchor being brought into contact with the second part adhesive portion;
    positioning said tubular anchor in said second part adhesive portion such that a solidified adhesive bond is formed on opposite sides of the contact juncture between a portion of the arcuate wall surface of said anchor and said circuit board, at which time the second part adhesive portion rapidly solidifies to form a fillet-shaped bond between said anchor and circuit board;
    threading a section of at least one elongated element, in the form of a wire, through said anchor so as to secure the threaded section of wire to said circuit board, and
    connecting opposite ends of said wire to spaced conductive sites on said board.

2. A method in accordance with claim 1 further comprising the step of initially forming said anchor in cylindrical configuration by slicing transversely a segment of predetermined length from an elongated section of plastic tubing of predetermined diameter and wall thickness.

3. A method of forming discrete circuit wiring on a circuit board including securing a tubular-shaped anchor having an outer wall surface of continuously arcuate profile in the circumferential direction, and adapted to retain an elongated element therewithin, on a circuit board, comprising the steps of:
    applying a viscous portion of adhesive on the surface of said circuit board at a desired anchor location;
    positioning said tubular anchor in said adhesive portion such that a solidified bond is formed on opposite sides of the contact juncture between a portion of the arcuate wall surface of said anchor and said circuit board;
    forming a continuously extending longitudinally disposed slit through the wall of said anchor, with the anchor material and thickness being chosen to provide a degree of anchor resiliency that allows a given elongated member to be readily forced through said slit into the central area of said anchor an releasably confined therewithin;
    forcing a section of at least one elongated element, in the form of a wire, through said slit in said anchor so as to releasably secure the confined section of wire to said circuit board, and
    connecting opposite ends of said wire to spaced conductive sites on said board.

4. A method in accordance with claim 3 further comprising the step of initially forming said anchor in cylindrical configuration by slicing transversely a segment of predetermined length from an elongated section of plastic tubing of predetermined diameter and wall thickness.

5. A method of forming discrete circuit wiring on a circuit board including forming an elongated element-retaining anchor and securing the anchor to the circuit board, comprising the steps of:
    slicing transversely a short segment from an elongated section of plastic tubing to form a cylindrically-shaped anchor;
    forming a longitudinally disposed slit through the wall of said anchor, with the anchor material and thickness being chosen to provide a degree of anchor resiliency that allows a given elongated element to be readily forced through said slit into the central area of said anchor and releasably confined therewithin;
    applying an adhesive to an area on the surface of said circuit board on which said anchor is to be secured;
    positioning said anchor at the desired location, and with the desired orientation, on the adhesive-coated surface of said circuit board, and in contact with said interposed adhesive to thereby effect the bonding of said anchor to the circuit board;
    forcing a section of said elongated element, in the form of a wire, through said slit in said anchor so as to releasably secure the confined section of wire to said circuit board, and connecting opposite ends of said wire to spaced conductive sites on said board.

6. A method in accordance with claim 5 wherein said adhesive applying step consists of applying a droplet on the desired surface of said circuit board at each location where an anchor is desired, and wherein said slit in each anchor is initially formed as part of one continuous slit in said elongated section of plastic tubing.

7. A method in accordance with claim 6 wherein said droplet comprises the second part of a two-part adhesive, with the first part comprising a liquid activator which is applied to at least a portion of the outer wall surface of said anchor, and is of a type that readily dries as a non-tacky coating at ambient temperature, and does not require a protective covering prior to each pre-coated anchor being brought into contact with a deposited second part adhesive droplet, at which time the latter rapidly solidifies to form a fillet-shaped adhesive bond between each such anchor and circuit board.

* * * * *